(12) United States Patent
Janssen et al.

(10) Patent No.: US 9,740,113 B2
(45) Date of Patent: Aug. 22, 2017

(54) LITHOGRAPHIC APPARATUS, DEVICE MANUFACTURING METHOD AND METHOD OF CLAMPING AN OBJECT

(71) Applicant: ASML Netherlands B.V., Veldhoven (NL)

(72) Inventors: Paul Janssen, Veldhoven (NL); Richard Joseph Bruls, Eindhoven (NL); Petrus Jacobus Maria Van Gils, Berkel-Enschot (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/029,565

(22) PCT Filed: Jun. 3, 2015

(86) PCT No.: PCT/EP2015/062351
§ 371 (c)(1),
(2) Date: Apr. 14, 2016

(87) PCT Pub. No.: WO2016/192785
PCT Pub. Date: Dec. 8, 2016

(65) Prior Publication Data
US 2017/0131643 A1   May 11, 2017

(30) Foreign Application Priority Data
Jul. 2, 2014   (EP) .................................... 14175411

(51) Int. Cl.
*G03B 27/58* (2006.01)
*G03F 7/20* (2006.01)
*H01L 21/683* (2006.01)

(52) U.S. Cl.
CPC ...... *G03F 7/70733* (2013.01); *G03F 7/70708* (2013.01); *G03F 7/70783* (2013.01); *H01L 21/6831* (2013.01); *G03F 7/70866* (2013.01)

(58) Field of Classification Search
CPC ............. G03F 7/70708; G03F 7/70783; G03F 7/70866; H01L 21/6831
(Continued)

(56) References Cited

U.S. PATENT DOCUMENTS 8,593,779 B2   11/2013   Sogard
8,976,335 B2   3/2015   Beerens et al.
(Continued)

FOREIGN PATENT DOCUMENTS

WO   2013/160026   10/2013

OTHER PUBLICATIONS

International Search Report and Written Opinion mailed Apr. 20, 2016 in corresponding International Patent Application No. PCT/EP2015/062351.
(Continued)

*Primary Examiner* — Peter B Kim
(74) *Attorney, Agent, or Firm* — Pillsbury Winthrop Shaw Pittman LLP

(57) ABSTRACT

A lithographic apparatus includes a first object holder and a second object holder. The first object holder is arranged to hold an object at a holder-facing surface. The object has the holder-facing surface. The second object holder is arranged to hold the object at the holder-facing surface. The lithographic apparatus is arranged to deform a contaminating particle at the holder-facing surface more when the object is held at the second object holder than when the object is held at the first object holder.

15 Claims, 7 Drawing Sheets

(58) Field of Classification Search
USPC .......................................................... 355/72
See application file for complete search history.

(56) References Cited

U.S. PATENT DOCUMENTS

| | | |
|---|---|---|
| 9,019,476 B2 | 4/2015 | Compen et al. |
| 2004/0130692 A1 | 7/2004 | Tanaka et al. |
| 2010/0236576 A1 | 9/2010 | Oae et al. |
| 2011/0164343 A1 | 7/2011 | Sogard |
| 2011/0222045 A1 | 9/2011 | Compen et al. |
| 2012/0043438 A1 | 2/2012 | De Jong, Jr. |
| 2012/0162621 A1 | 6/2012 | Beerens et al. |
| 2015/0103325 A1 | 4/2015 | Van Der Wilk et al. |

OTHER PUBLICATIONS

Michael R. Sogard et al., "Analysis of Coulomb and Johnsen-Rahbek electrostatic chuck performance in the presence of particles for extreme ultraviolet lithography," J. Micro/Nanolith. MEMS MOEMS, vol. 8, No. 4, pp. 041506-1-041506-9 (Oct./Dec. 2009).

LITHOGRAPHIC APPARATUS, DEVICE MANUFACTURING METHOD AND METHOD OF CLAMPING AN OBJECT

CROSS-REFERENCE TO RELATED APPLICATIONS

This application is the U.S. national phase entry of PCT patent application no. PCT/EP2015/062351, which was filed on Jun. 3, 2015, which claims the benefit of priority of EP application no. 14175411.9, which was filed on Jul. 2, 2014, and which is incorporated herein in its entirety by reference.

FIELD

The present invention relates to a lithographic apparatus, a device manufacturing method and a method of clamping an object.

BACKGROUND

A lithographic apparatus is a machine that applies a desired pattern onto a substrate, usually onto a target portion of the substrate. A lithographic apparatus can be used, for example, in the manufacture of integrated circuits (ICs).

When a substrate undergoes different lithography steps and process steps, a surface of the substrate can be contaminated by contaminating particles. The contaminating particles can be clamped between the substrate and the substrate table. Due to the presence of the contaminating particle, the substrate will be locally deformed. This causes focus and overlay errors. A similar issue arises for other objects, such as a patterning device.

It is desirable to reduce overlay and focus errors caused by particle contamination of objects such as the substrate and the patterning device.

SUMMARY

According to an aspect of the invention, there is provided a lithographic apparatus comprising a first object holder and a second object holder. The first object holder is arranged for holding an object at a holder-facing surface. The object has the holder-facing surface. The second object holder is arranged for holding the object at the holder-facing surface. The lithographic apparatus is arranged to deform a contaminating particle at the holder-facing surface more when the object is held at the second object holder than when the object is held at the first object holder.

According to an aspect of the invention, there is provided a device manufacturing method comprising using the lithographic apparatus mentioned above.

According to an aspect of the invention, there is provided a method of clamping an object. The method comprises holding the object at a first object holder at a holder-facing surface. The object has the holder-facing surface. The method comprises holding the object at a second object holder at the holder-facing surface. The second object holder is different from the first object holder. The method comprises deforming a contaminating particle at the holder-facing surface more when the object is held at the second object holder than when the object is held at the first object holder.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
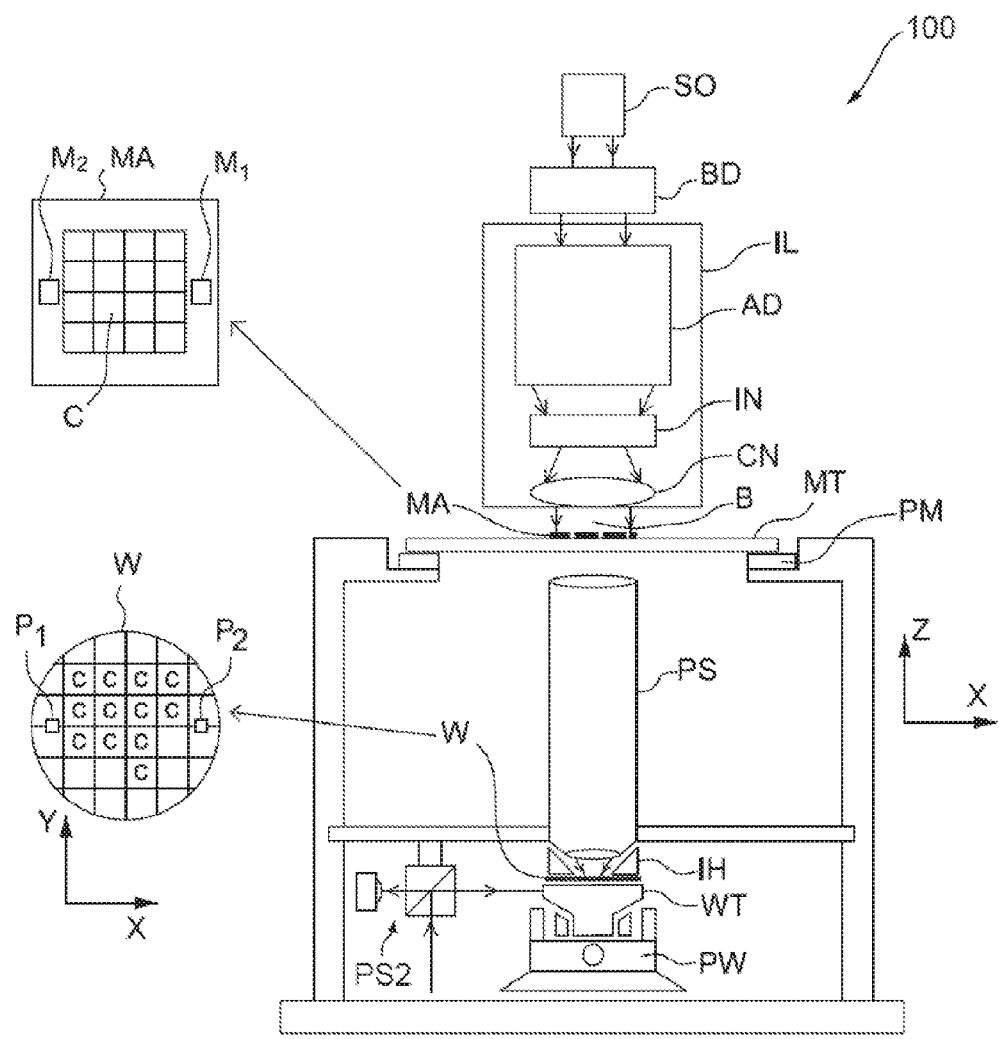
FIG. 1 depicts a lithographic apparatus according to an embodiment of the invention.

FIG. 1 schematically depicts a lithographic apparatus 100 according to an embodiment of the invention. The lithographic apparatus 100 includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device MA in accordance with certain parameters. The lithographic apparatus 100 also includes a substrate table (e.g. a wafer table) WT constructed to hold a substrate (e.g. a resist coated wafer) W and connected to a second positioning device PW configured to accurately position the substrate W in accordance with certain parameters. The lithographic apparatus 100 further includes a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The mask support structure MT supports, i.e. bears the weight of, the patterning device MA. The mask support structure MT holds the patterning device MA in a manner that depends on the orientation of the patterning device MA, the design of the lithographic apparatus 100, and other conditions, such as for example whether or not the patterning device MA is held in a vacuum environment. The mask support structure MT can use mechanical, vacuum, electrostatic or other clamping techniques to hold the patterning device. The mask support structure MT may be a frame or a table, for example, which may be fixed or movable as required. The mask support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart the radiation beam B with a pattern in its cross-section so as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam B will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system PS, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The illumination system IL may include an adjuster AD (not explicitly depicted in FIG. 4) configured to adjust the angular intensity distribution of the radiation beam. Generally, at least the outer and/or inner radial extent (commonly referred to as σ-outer and σ-inner, respectively) of the intensity distribution in a pupil plane of the illumination system IL can be adjusted. In addition, the illumination system IL may include various other components, such as an integrator IN and a condenser CN (not explicitly depicted in FIG. 4). The illumination system IL may be used to condition the radiation beam B, to have a desired uniformity and intensity distribution in its cross section. The illumination system IL may or may not be considered to form part of the lithographic apparatus 100. For example, the illumination system IL may be an integral part of the lithographic apparatus 100 or may be a separate entity from the lithographic apparatus 100. In the latter case, the lithographic apparatus 100 may be configured to allow the illumination system IL to be mounted thereon. Optionally, the illumination system IL is detachable and may be separately provided (for example, by the lithographic apparatus manufacturer or another supplier).

As here depicted, the lithographic apparatus 100 is of a transmissive type (e.g. employing a transmissive mask). Alternatively, the lithographic apparatus 100 may be of a reflective type (e.g. employing a programmable mirror array of a type as referred to above, or employing a reflective mask).

The lithographic apparatus 100 may be of a type having two (dual stage) or more substrate tables WT (and/or two or more mask support structures MT, e.g. mask tables). In such a "multiple stage" lithographic apparatus 100 the additional substrate tables WT and/or mask support structures MT may be used in parallel, or preparatory steps may be carried out on one or more substrate tables WT and/or mask support structures MT while one or more other substrate tables WT and/or mask support structures MT are being used for exposure.

The patterning device MA is held on the mask support structure MT. The radiation beam B is incident on the patterning device MA. The radiation beam B is patterned by the patterning device MA. After being reflected from the patterning device MA, the radiation beam B passes through the projection system PS. The projection system PS focuses the radiation beam B onto a target portion C of the substrate W. The first positioner PM and a first position sensor PS1 (e.g., an interferometric device, linear encoder or capacitive sensor) can be used to accurately position the patterning device MA with respect to the path of the radiation beam B. The first position sensor is not explicitly shown in FIG. 1. With the aid of the second positioner PW and a second position sensor PS2 (e.g., an interferometric device, linear encoder or capacitive sensor), the substrate table WT can be moved accurately, e.g., so as to position different target portions C in the path of the radiation beam B.

In general, movement of the mask support structure MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioner PW. In the case of a stepper (as opposed to a scanner) the mask support structure MT may be connected to a short-stroke actuator only, or may be fixed. The patterning device MA may be aligned using mask alignment marks $M_1$, $M_2$. The substrate W may be aligned using substrate alignment marks $P_1$, $P_2$. Although the substrate alignment marks $P_1$, $P_2$ as illustrated occupy dedicated target portions C, they may be located between target portions C (these are known as scribe-lane alignment marks). Similarly, in situations in which more than one die is provided on the patterning device MA, the mask alignment marks $M_1$, $M_2$ may be located between the dies.

Immersion techniques can be used to increase the numerical aperture NA of the projection system PS. As depicted in FIG. 1, in an embodiment the lithographic apparatus 100 is of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus 100, for example, between the patterning device MA and the projection system PS. The term "immersion" as used herein does not mean that a structure, such as the substrate W, must be submerged in liquid, but rather only means that a liquid is located between the projection system PS and the substrate W during exposure.

Referring to FIG. 1, the illuminator IL receives a radiation beam from a source module SO. The source module SO and the lithographic apparatus 100 may be separate entities, for example when the source module SO is an excimer laser. In such cases, the source module SO is not considered to form part of the lithographic apparatus 100 and radiation is passed from the source module SO to the illumination system IL with the aid of a beam delivery system BD. In an embodiment the beam delivery system BD includes, for example, suitable directing mirrors and/or a beam expander. In other cases the source module SO may be an integral part of the lithographic apparatus 100, for example when the source module SO is a mercury lamp. The source module SO and the illumination system IL, together with the beam delivery system BD if required, may be referred to as a radiation system.

The term "radiation beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

Arrangements for providing liquid between a final element of the projection system PS and the substrate W can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

As depicted in FIG. 1 the liquid supply system is provided with a liquid confinement structure IH which extends along at least a part of a boundary of the space between the final element of the projection system PS and the substrate W, substrate table WT or both.

In order to shorten the exposure wavelength and, thus, reduce the minimum printable size, it has been proposed to use an extreme ultraviolet (EUV) source of radiation, EUV radiation is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

In use of the lithographic apparatus 100, a substrate W undergoes different lithography steps and process steps. For example, a substrate W is transferred to the substrate table WT. Before the substrate W is transferred to the substrate table WT, the substrate W may undergo other lithography steps and process steps. For example, the substrate W may be transferred to a pre-align table PT (depicted in FIG. 2, for example).

A substrate W may be cleaned, for example by a wet chemical treatment. The substrate W may be heated to a temperature sufficient to drive off any moisture that may be present on the surface of the substrate W. The substrate W may be covered with a layer of resist (e.g. photoresist). The substrate W may be prebaked to drive off excess photoresist solvent. The substrate W is then exposed so that a pattern in the radiation beam B is transferred onto the substrate W. The substrate W may then undergo developing, etching and removal of the resist. These steps may be repeated for a further layer on the substrate W. The substrate W can be contaminated during these lithography steps and process steps. In particular, any contaminating particle before an exposure can have a negative effect on overlay and focus during that exposure.

In an embodiment, the lithographic apparatus 100 comprises a first object holder and a second object holder. The first object holder is arranged for holding an object at a holder-facing surface. The object has the holder-facing surface. The second object holder is arranged for holding the object at the holder-facing surface. The lithographic apparatus is arranged to deform a contaminating particle at the holder-facing surface more when the object is held at the second object holder than when the object is held at the first object holder.

In an embodiment, the first object holder is an exposure object holder. The second object holder is a preparation object holder. The object is the substrate W. The exposure object holder may comprise substrate table WT. The preparation object holder may comprise pre-alignment table PT.

In an embodiment the lithographic apparatus 100 comprises a pre-alignment positioner 91 and a pre-alignment position sensor 92 configured to position the substrate W on the pre-align table PT. In an embodiment the lithographic apparatus 100 comprises an exposure positioner 96 and an exposure position sensor 97 configured to position the substrate W on the substrate table WT. In an embodiment the pre-alignment positioner 91 and the pre-alignment position sensor 92 have a greater range and less accuracy than the exposure positioner 96 and the exposure position sensor 97. The substrate W may be positioned on the pre-align table PT so as to position the substrate W at an intermediate level of accuracy. Subsequently the substrate W can be positioned on the substrate table WT at a higher level of accuracy for an exposure process. The pre-alignment positioner 91 and the pre-alignment position sensor 92 position the substrate W on the pre-align table PT such that the substrate W is positioned to an accuracy within a range of the exposure positioner 96 and the exposure position sensor 97.

When a substrate W undergoes the different lithography steps and process steps, substrate back side particle contamination is practically unavoidable. Substrate back side particle continuation occurs when a contaminating particle 50 attaches onto a holder-facing surface 52 of the substrate W. The holder-facing surface 52 of the substrate W may be called the substrate back side.

There are many types of contaminating particle 50. A contaminating particle 50 may be a contaminating particle 50 of aluminium. Some contaminating particles 50 may be harder than aluminium. For example a contaminating particle 50 may be a contaminating particle 50 of hardened steel. Some contaminating particles 50 may be softer than aluminium. For example a contaminating particle 50 may be a contaminating particle 50 of polymethylmethacrylate. A typical size of a contaminating particle 50 may be in the range of from about 0.5 μm to about 50 μm. Contaminating particles 50 can have a diameter smaller than about 0.5 μm. Contaminating particles 50 can have a diameter greater than about 50 μm. Larger contaminating particles 50 less frequently attach to the holder-facing surface 52 of the substrate W.

During an exposure process, a pattern in the radiation beam B is illuminated onto the substrate W. During the exposure process, it is desirable for the substrate W to be positioned accurately on the substrate table WT. During an exposure process, it is desirable for the substrate W to be positioned stably on the substrate table WT. During an exposure process, it is desirable for the substrate W to be positioned as flat as possible on the substrate table WT. This is also true during a pre-exposure step. A pre-exposure may be performed at the substrate table WT. In an embodiment the pre-exposure step comprises controlling a height (i.e. height leveling) of the substrate W. In an embodiment the pre-exposure step comprises measuring an alignment (i.e. alignment measurement) of the substrate W. An embodiment of the invention is expected to improve the position of the substrate W for the pre-exposure step. In an embodiment the substrate W is held onto the substrate table WT by an exposure clamping force. In an embodiment the exposure clamping force is an electrostatic clamping force.

The lithographic apparatus 100 may have a first clamping device and a second clamping device. The first clamping device is arranged to apply a first clamping force to hold the object on the first object holder. The second clamping device is arranged to apply a second clamping force to hold the object on the second object holder. The second clamping force is larger than the first clamping force. The first clamping device may comprise an exposure clamping mechanism. The second clamping device may comprise a preparation clamping mechanism.

Figure 2:
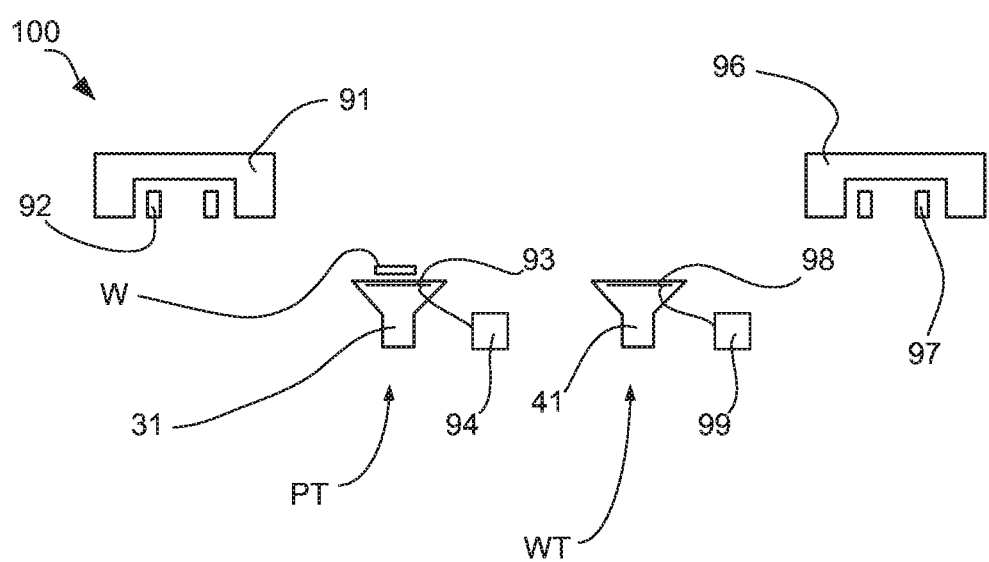
FIG. 2 depicts part of a lithographic apparatus according to an embodiment of the invention.

As depicted in FIG. 2, in an embodiment an exposure clamping mechanism 98, 99 is an electrostatic clamping mechanism and comprises at least one electrode 98 in the substrate table WT. A power supply 99 supplies electrical power to the electrode 98. An exposure clamping force is produced between the substrate table WT and the substrate W. In an electrostatic clamping mechanism, the clamping force is an electrostatic clamping force.

In an embodiment the exposure clamping force is a pressure clamping force. A pressure clamping force may be produced in a vacuum clamping mechanism. In a vacuum clamping mechanism, a chamber between the substrate table WT and the substrate W is connected to an underpressure. The pressure in the chamber is less than the ambient pressure outside of the chamber, e.g. surrounding the substrate W and the substrate table WT. A pressure clamping force is provided between the substrate W and the substrate table WT.

Similarly, the substrate W may be held onto the pre-align table PT by a preparation clamping force, which may be an electrostatic clamping force or a pressure clamping force. FIG. 2 depicts a preparation clamping mechanism 93, 94 holding the substrate W onto the pre-align table PT. In an embodiment the preparation clamping mechanism is an electrostatic clamping mechanism and comprises at least one electrode 93 and a power supply 94. The function of the electrode 93 and the power supply 94 of the preparation clamping mechanism correspond to the function of the electrode 98 and the power supply 99 of the exposure clamping mechanism.

Figure 4:
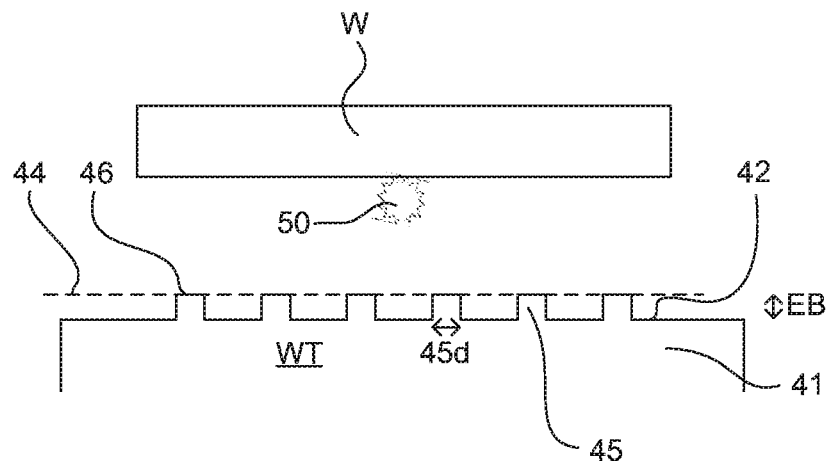
FIGS. 4 and 5 depict a contaminating particle being clamped between a substrate and a substrate table.
Figure 5:
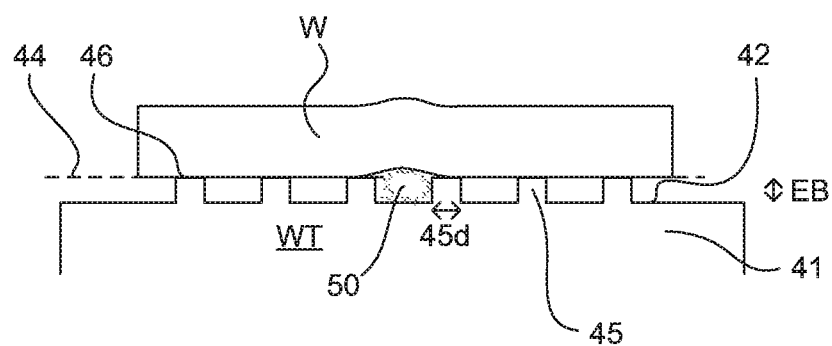

When a contaminating particle 50 is located on the holder-facing surface 52 of the substrate, the contaminating particle 50 will be clamped between the substrate W and the substrate table WT. This is illustrated in FIGS. 4 and 5. FIG. 4 depicts a contaminating particle 50 located on the holder-facing surface 52 of a substrate W. FIG. 5 depicts a contaminating particle 50 clamped between a substrate W and a substrate table WT. FIG. 4 depicts a situation before the substrate W is clamped onto the substrate table WT. FIG. 5 depicts a situation after the substrate W is clamped onto the substrate table WT.

Due to the presence of the contaminating particle 50, the substrate W is locally deformed. This is depicted in FIG. 5. The deformation of the substrate W can cause a focus error and/or an overlay error. For example, the deformation of the substrate W can cause part of the image patterned onto the substrate W to be displaced horizontally. As another example, the deformation can cause a distortion of the pattern transferred onto the substrate W from the radiation beam B.

The magnitude of the error is related to the properties of the contaminating particle 50. For example, errors increase with increasing size of a contaminating particle 50. As another example, errors increase with increasing hardness or increasing yield strength of a contaminating particle 50.

The substrate W is an example of an object used in the lithographic apparatus 100. A situation similar to the situation described above can occur for other objects used in the lithographic apparatus 100. For example, a similar situation can occur due to contamination of the patterning device MA. When a contaminating particle 50 is located on the holder-facing surface of the patterning device MA, the contaminating particle 50 will be clamped between the patterning device MA and the mask support structure MT. Due to the presence of the contaminating particle 50, the patterning device MA will be locally deformed. The deformation of the patterning device MA yields in focus and overlay errors. For example, part of the image patterned onto the substrate W may be displaced horizontally. Or there may be a distortion of the pattern transferred onto the substrate W from the radiation beam B.

Deformation of the patterning device MA can be more serious than deformation of the substrate W. This is because a deformation of the patterning device MA can affect many substrates W patterned according to the patterning device MA. In contrast, deformation of a substrate W may affect only that substrate W.

The invention will be described below with reference to a substrate W as an object, a substrate table WT as an exposure object holder and a pre-align table PT as a preparation object holder. This makes the explanation of the invention clearer. However, the invention is applicable to other types of object, exposure object holder and preparation object holder of a lithographic apparatus 100. For example, instead of the object being a substrate W, the object may be a patterning device MA. Instead of the exposure object holder being a substrate table WT, the exposure object holder may be the mask support structure MT. Instead of the preparation object holder being the pre-align table PT, the preparation object holder may be a substrate handler or a dedicated pre-crusher or the substrate table WT, for example.

In an embodiment the lithographic apparatus 100 comprises a preparation object holder such as a pre-align table PT. The present invention is applicable to other types of preparation object holder such as a stage used for supporting a patterning device MA before the patterning device MA is supported by the mask support structure MT.

Figure 3:
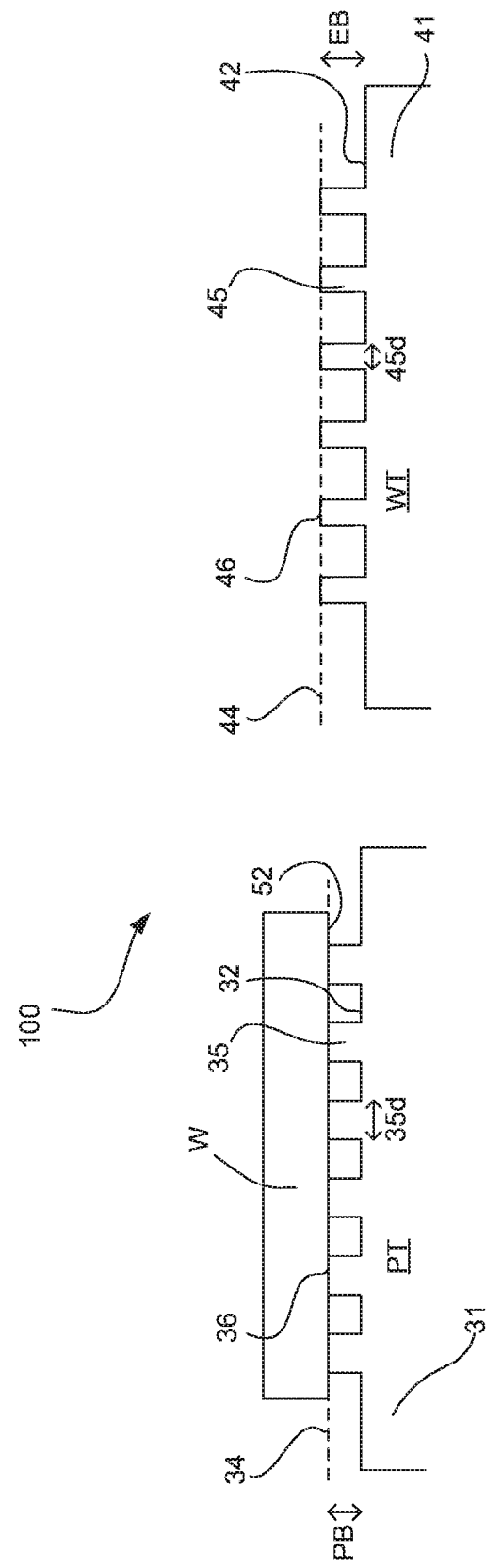
FIG. 3 depicts part of a lithographic apparatus according to an embodiment of the invention.

FIG. 3 depicts schematically part of a lithographic apparatus 100 according to an embodiment of the invention. The pre-align table PT comprises a preparation main body 31. The preparation main body 31 has a preparation base surface 32. The pre-align table PT is arranged to support the holder-facing surface 52 of the substrate W at preparation support locations in a preparation supporting plane 34. In FIG. 3, the preparation supporting plane 34 is depicted by a broken line.

A preparation base distance PB is defined between the preparation base surface 32 and the preparation supporting plane 34. As depicted in FIG. 3, for example, in an embodiment the preparation base surface 32 is distanced from the preparation supporting plane 34 such that the preparation base distance PB is non-zero.

As depicted in FIG. 3, in an embodiment the pre-align table PT comprises a plurality of preparation burls 35. The plurality of preparation burls 35 project from the preparation base surface 32. The preparation burls 35 have preparation end surfaces 36. As depicted in FIG. 3, the preparation end surfaces 36 are at the preparation support locations to support the substrate W.

In an embodiment the substrate table WT comprises a plurality of exposure burls 45. The exposure burls 45 project from the exposure base surface 42. The exposure burls 45 have exposure end surfaces 46. The exposure end surfaces 46 are at the exposure support locations to support the substrate W.

The height of the exposure burls 45 is not particularly limited. In an embodiment the height of the exposure burls 45 of the substrate table WT is no less than 1 µm. In an embodiment the height of the exposure burls 45 of the substrate table WT is no more than 500 μm. In an embodiment the height of the exposure burls 45 of the substrate table WT is in the range of from about 1 μm to about 20 μm. In an embodiment the height of the exposure burls 45 of the substrate table WT is in the range of from about 50 μm to about 200 μm.

By providing that the preparation base distance PB is non-zero, a gap is provided between the preparation base surface 32 and the holder-facing surface 52 of the substrate W. If a vacuum clamp is used to hold the substrate W to the pre-align table PT, a chamber associated with the gap can be connected to an underpressure so as to generate the pressure clamping force. If the substrate W is clamped onto the pre-align table PT by an electrostatic clamp, the electrostatic clamping force scales approximately quadratically with the preparation base distance PB. The desired clamping force may be taken into account when selecting the preparation base distance PB.

Figure 8:
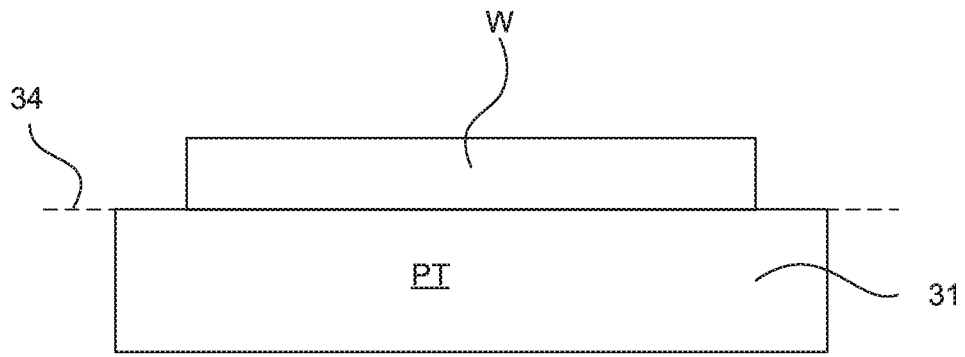
FIG. 8 depicts a preparation table according to an embodiment of the invention.

However, it is not necessary for the preparation base distance PB to be non-zero. In an embodiment the preparation base distance is zero, for example as depicted in FIG. 8.

It is not necessary for the pre-align table PT to comprise a plurality of preparation burls 35. For example, in an embodiment the pre-align table PT comprises no burls, as depicted in FIG. 8. In the arrangement depicted in FIG. 8, the preparation base distance PB is zero. By providing that the preparation base distance PB is zero, the difference between the preparation base distance PB and the exposure base distance EB is maximised. Accordingly, the effect of pre-crushing contaminating particles at the holder-facing surface 52 of the substrate W is maximised.

As depicted in FIG. 3, in an embodiment the preparation base surface 32 is substantially flat. However, it is not necessary for the preparation base surface 32 to be completely flat. For example, in an embodiment the preparation base surface 32 is undulating or may be sloped.

As depicted in FIG. 3, in an embodiment the preparation base surface 32 is substantially planar and parallel to the preparation supporting plane 34. Accordingly, the preparation base distance PB is substantially constant across the whole of the preparation base surface 32. However, it is not necessary for the preparation base surface 32 to be substantially planar. For example, in an embodiment the preparation base surface 32 may comprise a plurality of regions at different levels. Each region of the preparation base surface 32 may correspond to a different preparation base distance PB.

Figure 7:
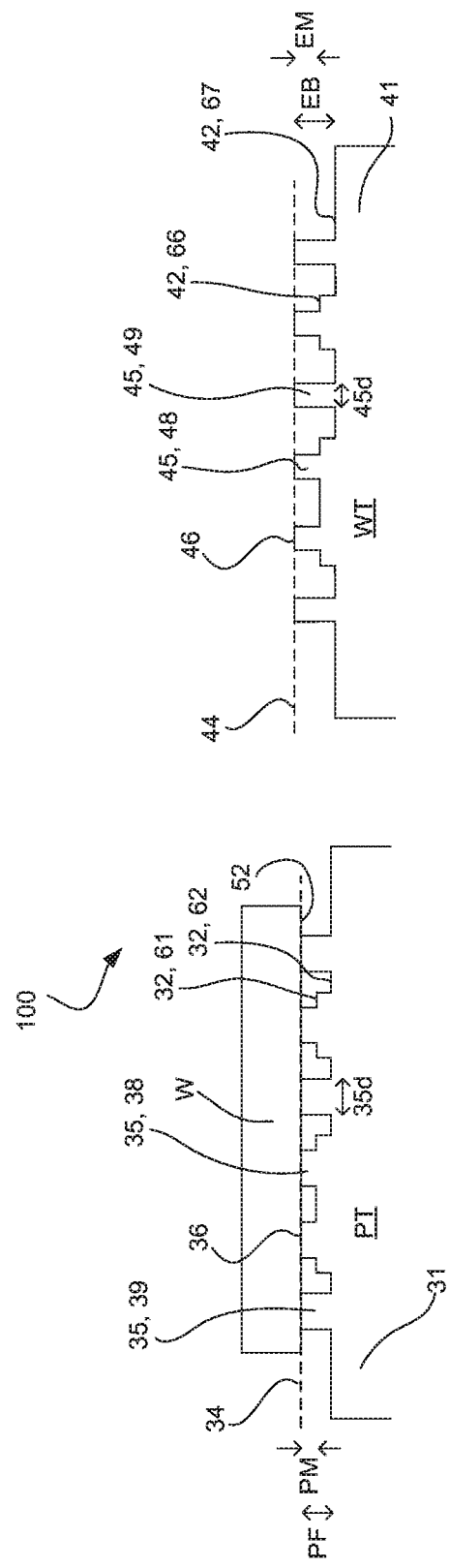
FIG. 7 depicts part of a lithographic apparatus according to an embodiment of the invention.

For example, FIG. 7 depicts an embodiment in which the preparation base surface 32 comprises a preparation mesa region 61 and a preparation floor region 62. The distance between the preparation mesa region 61 and the preparation supporting plane 34 is less than the distance between the preparation floor region 62 and the preparation supporting plane 34. Accordingly, the preparation base distance PB at the preparation mesa region 61 is smaller than the preparation base distance PB at the preparation floor region 62.

In an embodiment the lithographic apparatus 100 comprises a substrate table WT as an exposure object holder. In an embodiment, the substrate table WT comprises an exposure main body 41. The exposure main body 41 has an exposure base surface 42. Various arrangements are possible for the exposure base surface 42, as described above in relation to the preparation base surface 32. It is not necessary for the arrangement of the exposure base surface 42 to be exactly the same as the arrangement of the preparation base surface 32. However, in an embodiment the arrangement of the exposure base surface 42 is substantially the same as the arrangement of the preparation of base surface 32.

In an embodiment the substrate table WT is arranged to support the holder-facing surface 52 of the substrate W at exposure support locations in an exposure supporting plane 44. An exposure base distance EB is defined between the exposure base surface 42 and the exposure supporting plane 44. The features of the exposure supporting plane 44 and the exposure base distance EB may vary in corresponding fashion to the features of the preparation supporting plane 34 and the preparation base distance PB.

In an embodiment, there is provided a method of clamping the substrate W. In an embodiment the method comprises providing the pre-align table PT, as described above. In an embodiment the method comprises providing the substrate table WT, as described above.

As depicted in FIG. 2, in an embodiment, the lithographic apparatus 100 comprises a preparation clamping mechanism 93, 94. The preparation clamping mechanism 93, 94 is arranged to apply a preparation clamping force between the pre-align table PT and the substrate W on the pre-aligned table WT. The preparation clamping force is applied so as to deform any contaminating particle 50 on the holder-facing surface 52 of the substrate W.

As depicted in FIG. 2, in an embodiment the preparation clamping mechanism 93, 94 comprises at least one electrode 93 and a power supply 94. Hence, the preparation clamping mechanism 93, 94 may be an electrostatic clamping mechanism. However, it is not necessary for the preparation clamping mechanism 93, 94 to be an electrostatic clamping mechanism. For example, in an embodiment the preparation clamping mechanism is a vacuum clamping mechanism, as described above.

As depicted in FIG. 2, in an embodiment the lithographic apparatus 100 comprises an exposure clamping mechanism 98, 99. The exposure clamping mechanism 98, 99 is arranged to apply an exposure clamping force between the substrate table WT and the substrate W on the substrate table WT. The exposure clamping force is applied so as to hold the substrate W for an exposure process.

As depicted in FIG. 2, in an embodiment the exposure clamping mechanism 98, 99 comprises at least one electrode 98 and a power supply 99. Hence, in an embodiment the exposure clamping mechanism 98, 99 is an electrostatic clamping mechanism. However, it is not necessary for the exposure clamping mechanism to be an electrostatic clamping mechanism. For example, in an embodiment, the exposure clamping mechanism is a vacuum (i.e. pressure) clamping mechanism.

In an embodiment, the method of clamping the substrate W comprises applying the preparation clamping force between the pre-align table PT and the substrate W on the pre-align table PT, so as to deform any contaminating particle 50 on the holder-facing surface 52 of the substrate W.

An embodiment of the invention is expected to achieve a reduction of overlay and focus errors caused by particle contamination at the holder-facing surface 52 of the substrate W. This is achieved by so-called pre-crushing of contaminating particles 50 before the substrate W is clamped at the substrate table WT. By pre-crushing a contaminating particle 50, the height of the contaminating particle 50 can be significantly reduced. This can result in a corresponding reduction in deformation of the substrate W when the substrate W is clamped at the substrate table WT. The reduction in deformation of the substrate W leads to an improved overlay and focus performance. An embodiment of the invention is expected to achieve similar effects when the invention is applied to clamping of the patterning device MA at the mask support structure MT.

Figure 9:
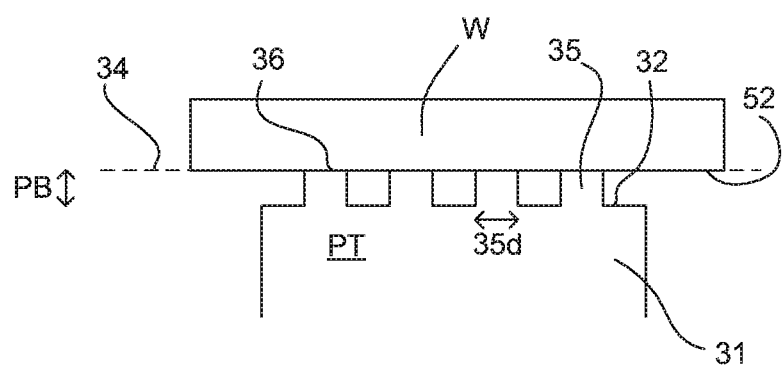
FIG. 9 depicts a preparation table according to an embodiment of the invention.

In an embodiment the pre-align table PT and the substrate table WT have a similar structure. For example, the area of the preparation base surface 32 may be similar to the area of the exposure base surface 42. However, it is not necessary for the structure of the pre-align table PT to be the same as the structure of the substrate table WT. For example, in an embodiment, the pre-align table PT is smaller than the substrate table WT. As depicted in FIG. 9, in an embodiment the pre-align table PT is smaller than the substrate W such that part of the substrate W extends beyond the pre-align table PT when the pre-align table PT holds the substrate W.

The first object holder may be arranged to support the object at a portion of the holder-facing surface. The second object holder may be arranged to support the object at substantially the same portion of the holder-facing surface.

It may be that the pre-align table PT does not pre-crush contaminating particles 50 across the entire holder-facing surface 52 of the substrate W. Depending on the lithography steps and process steps, a substrate W may show a fingerprint (i.e. a distinctive pattern) of contaminating particles 50 at its holder-facing surface 52. For example, a fingerprint of a substrate W may show areas of the holder-facing surface 52 with a larger density of contaminating particles 50. Hence, the positioning of the substrate W on the pre-align table PT may be targeted so as to pre-crush contaminating particles 50 in areas with a larger density of contaminating particles 50.

The fingerprint of contaminating particles 50 at the holder-facing surface 52 of the substrate W can vary. For example, the fingerprint can vary depending on the history of the substrate W, such as which lithography steps and process steps the substrate W has undergone. Generally, it is expected that substrates W that have undergone the same lithography steps and process steps will have similar fingerprints. Hence, depending on the fingerprint of the substrate W, the arrangement of the pre-align table PT may be selected so as to pre-crush high density areas of contaminating particles 50.

As depicted schematically in FIG. 3, in an embodiment the preparation base distance PB is smaller than the exposure base distance EB. In an embodiment the preparation base distance PB is smaller than the exposure base distance EB for the whole of the holder-facing surface 52 of the substrate W. However, it is not necessary for the preparation base distance PB to be less than the exposure base distance EB for the whole area of the holder-facing surface 52 of the substrate W. In an embodiment the preparation base distance PB is smaller than the exposure base distance EB for only a part of the holder-facing surface 52 of the substrate W. In an embodiment, the preparation base distance PB is smaller than the exposure base distance EB for at least part of the preparation base surface 32 and a corresponding part of the exposure base surface 42. The preparation base distance PB at a given point on the substrate W is smaller than the exposure base distance EB at the same point (i.e. it is a point-to-point comparison).

By providing that the preparation base distance PB is smaller than the exposure base distance EB, an embodiment of the invention is expected to achieve a significant reduction of overlay and focus errors caused by particle contamination at the holder-facing surface 52 of the substrate W. This is achieved by plastically yielding the contaminating particle 50 on a pre-crusher (e.g. the pre-align table PT) which has, for example, a smaller burl height. FIG. 3 schematically depicts that the height of the preparation burls 35 of the pre-align table PT is smaller than the height of the exposure burls 45 of the substrate table WT. In the arrangement depicted in FIG. 3, the preparation base distance PB corresponds to the height of the preparation burls 35. In the arrangement depicted in FIG. 3, the exposure base distance EB corresponds to the height of the exposure burls 45. In an embodiment the contaminating particle 50 is crushed to a size smaller than the exposure base distance EB.

In an embodiment the method of clamping the substrate W comprises transferring the substrate W from the pre-align table PT to the substrate table WT. For example, the substrate W may be transferred from the pre-align table PT to the substrate table WT by a substrate handler.

In an embodiment the method of clamping the substrate W comprises applying the exposure clamping force between the substrate table WT and the substrate W on the substrate table WT, so as to hold the substrate W for an exposure process. Accordingly, when the substrate W is held on the substrate table WT for the exposure process, the contaminating particles 50 have already been plastically yielded to an extent. As a result, the contaminating particles 50 do not deform the substrate W as much as otherwise.

In particular, by providing that the preparation base distance PB is smaller than the exposure base distance EB, the effect of the contaminating particles 50 on the deformation of the substrate W is significantly reduced. However, it is not necessary for the preparation base distance PB to be smaller than the exposure base distance EB. In an embodiment, the preparation base distance PB is equal to the exposure base distance EB. In an embodiment the structure of the pre-align table PT is substantially the same as the structure of the substrate table WT.

For example, in an embodiment the preparation clamping mechanism 93, 94 is configured to apply a preparation clamping force that is greater than the exposure clamping force that the exposure clamping mechanism 98, 99 is configured to apply. In an embodiment, in the method of clamping the substrate W, the preparation clamping force is greater than the exposure clamping force. In an embodiment the preparation clamping mechanism 93, 94 is configured to apply varying values of preparation clamping force. In an embodiment the exposure clamping mechanism 98, 99 is configured to apply varying values of exposure clamping force. In an embodiment the preparation clamping mechanism 93, 94 is configured to apply a maximum preparation clamping force that is greater than the maximum exposure clamping force that the exposure clamping mechanism 98, 99 is configured to apply. In an embodiment, in the method of clamping the substrate W, the maximum preparation clamping force is greater than the maximum exposure clamping force.

By providing that the preparation clamping force is greater than the exposure clamping force, contaminating particles 50 can be pre-crushed before the substrate W is clamped at the substrate table WT. A greater preparation clamping force plastically yields the contaminating particles 50 to a greater extent. Accordingly, a greater preparation clamping force leads to smaller contaminating particles 50 when the substrate W is clamped at the substrate table WT. As a result, the greater preparation clamping force reduces the negative effects on overlay and focus performance caused by particle contamination.

However, it is not necessary for the preparation clamping force to be greater than the exposure clamping force. For example, in an embodiment the preparation clamping force is substantially the same as the exposure clamping force.

However, by providing that the preparation base distance PB is less than the exposure base distance EB, an embodiment of the invention is expected to achieve an improvement in overlay and focus performance.

In an embodiment the preparation clamping force is greater than the exposure clamping force and the preparation base distance PB is smaller than the exposure base distance EB. Hence, the contaminating particles 50 may be plastically yielded by a pre-crusher (e.g. the pre-align table PT) which has a combination of a smaller burl height and a higher clamping pressure. This significantly reduces the height of the contaminating particles 50 and corresponding deformation of the substrate W on the substrate table WT. This reduction leads to an increased overlay and focus performance.

In an embodiment the preparation clamping force is equal to or less than the exposure clamping force. In an embodiment the preparation clamping force is less than the exposure clamping force. The contaminating particles 50 can be pre-crushed to a significant extent by providing that the preparation base distance PB is less than the exposure base distance EB, even when the preparation clamping force is less than the exposure clamping force. A difference in burl height is expected to achieve a greater improvement than increasing the preparation clamping force. In an embodiment the preparation clamping force is applied a plurality of times. Multiple clamping actions are performed at the pre-align table PT. By performing multiple clamping actions at the pre-align table PT, the contaminating particles 50 can be pre-crushed to a significant extent even if the preparation clamping force is not greater than the exposure clamping force and there is no difference in burl height. In an embodiment, multiple clamping actions are performed at the pre-align table PT and the preparation clamping force is greater than the exposure clamping force. In an embodiment, multiple clamping actions are performed at the pre-align table PT and there is a difference in burl height. Performing the clamping action multiple times increases the extent of pre-crushing.

It can be difficult to provide an electrostatic clamping mechanism that generates enough clamping force to hold the substrate W during an exposure process. It is easier to provide a preparation clamping mechanism that applies a preparation clamping force less than the exposure clamping force. An embodiment of the invention is expected to achieve a reduction in cost of the preparation clamping mechanism 93, 94 used to clamp the substrate W on the pre-align table PT. An embodiment of the invention is expected to make it easier to manufacture the pre-align table PT.

A specific example of the invention is described as follows. The specific example is of course merely exemplary and does not limit the invention. In the specific example, the exposure clamping mechanism 98, 99 applies an exposure clamping force of about 40,000 Pa. The substrate table WT comprises exposure burls 45 at a height of 5 µm. Hence, the exposure base distance EB is 5 µm. Hence, any contaminating particle 50 having a diameter of greater than 5 µm can lead to deformation of the substrate W when the substrate W is held onto the substrate table WT. In this description, references to the diameter of a contaminating particle 50 should be read as referring to the equivalent spherical diameter of a contaminating particle, where appropriate (i.e. where the contaminating particle 50 is not a sphere, but is an irregularly-shaped object). The equivalent spherical diameter of an irregularly-shaped object is the diameter of a sphere of equivalent volume. Contaminating particles 50 having a diameter of greater than 16 µm are expected to provide a particularly significant negative overlay contribution.

In the specific example, the preparation clamping mechanism 93, 94 applies a preparation clamping force of about 10,000 Pa. Hence the preparation clamping clamping is about one quarter of the exposure clamping force. The pre-align table PT has a similar structure to the substrate table WT, except that the height of the preparation burls 35 is 4 µm (instead of 5 µm). The preparation base distance PB is 4 µm.

According to the specific example, by pre-crushing contaminating particles 50 on the pre-align table PT, all contaminating particles 50 up to a diameter of 44 µm are yielded to a height smaller than 5 µm. Statistically, the occurrence of contaminating particles 50 having a diameter of 44 µm is about five to ten times less likely than contaminating particles 50 have a diameter of 16 µm. However, larger contaminating particles 50 provide a greater undesirable contribution to overlay and focus errors.

In the specific example, the preparation clamping force is four times less than the exposure clamping force. However, by providing that the preparation base distance PB is 1 µm less than the exposure base distance EB, substantially all contaminating particles 50 up to a diameter of 44 µm are plastically yielded to a size at which they have no effect on deformation on substrate W when the substrate W is held on the substrate table WT. Accordingly, the significant contribution to focus and overlay errors caused by contaminating particles 50 having a diameter greater than 16 µm is at least reduced, and possibly avoided.

Larger contaminating particles have a greater negative effect on overlay and focus errors. The effect of contaminating particles 50 on overlay and focus errors is non-linear with respect to the increase in size of the contaminating particle 50. In the specific example, a contaminating particle 50 having a diameter of 26 µm provides an error contribution that is about ten times greater than that of a contaminating particle 50 having a diameter of 16 µm.

A second specific example of the invention is described as follows. In the second specific example, the exposure clamping mechanism 98, 99 applies an exposure clamping force of about 100,000 Pa. The substrate table WT comprises exposure burls 45 at a height of 20 µm. Hence, the exposure base distance EB is 20 µm. Hence, any contaminating particle 50 having a diameter of greater than 20 µm can lead to deformation of the substrate W when the substrate W is held onto the substrate table WT. In the second specific example, contaminating particles 50 having a diameter of greater than 27 µm are expected to provide a particularly significant negative overlay contribution.

In the second specific example, the preparation clamping mechanism 93, 94 applies a preparation clamping force of about 25,000 Pa. Hence the preparation clamping force is about one quarter of the exposure clamping force. The pre-align table PT has a similar structure to the substrate table WT, except that the height of the preparation burls 35 is 19 µm (instead of 20 µm). The preparation base distance PB is 19 µm.

According the second specific example, by pre-crushing contaminating particles 50 on the pre-align table PT, all contaminating particles 50 up to a diameter of 80 µm are yielded to a height smaller than 20 µm. Statistically, the occurrence of contaminating particles 50 having a diameter of 80 µm is about five to ten times less likely than contaminating particles 50 have a diameter of 27 µm. However, larger contaminating particles 50 provide a greater undesirable contribution to overlay and focus errors.

A third specific example of the invention is described as follows. In the third specific example, the exposure clamping mechanism 98, 99 applies an exposure clamping force of about 25,000 Pa. The substrate table WT comprises exposure burls 45 at a height of 10 µm. Hence, the exposure base distance EB is 10 µm. Hence, any contaminating particle 50 having a diameter of greater than 10 µm can lead to deformation of the substrate W when the substrate W is held onto the substrate table WT. In the third specific example, contaminating particles 50 having a diameter of greater than 18 µm are expected to provide a particularly significant negative overlay contribution.

In the third specific example, the preparation clamping mechanism 93, 94 applies a preparation clamping force of about 100,000 Pa. Hence the preparation clamping is about four times larger than the exposure clamping force. The pre-align table PT has a similar structure to the substrate table WT and that the height of the preparation burls 35 is also 10 µm. The preparation base distance PB is 10 µm.

According the third specific example, by pre-crushing contaminating particles 50 on the pre-align table PT, all contaminating particles 50 up to a diameter of 22 µm are yielded to a height smaller than 10 µm. Statistically, the occurrence of contaminating particles 50 having a diameter of 22 µm is up to about two times less likely than contaminating particles 50 having a diameter of 18 µm.

In the specific examples, the contaminating particle 50 is made of aluminium. Aluminium has a particle yield strength of about 310 MPa. Other contaminating particles 50 expected in the lithographic apparatus 100 have a hardness greater than that of aluminium.

Other contaminating particles 50 have a hardness less than that of aluminium.

As mentioned above, a difference in burl height is more effective in reducing areas than an increase in the preparation clamping pressure. This is because at a certain crushing point, pressure cannot be exerted on the partly crushed contaminating particle 50 even if the clamping force is increased.

In an embodiment, for at least part of the holder-facing surface 52 of the substrate W, the preparation base distance PB is at least about 1 µm smaller than the exposure base distance EB. A larger difference between the preparation base distance PB and the exposure base distance EB produces a better effect in improving overlay and focus errors. For example, in an embodiment the preparation base distance PB is at least about 2 µm smaller than the exposure base distance EB.

In an embodiment the preparation end surfaces 36 of the preparation burls 35 have a larger area than the exposure end surfaces 46 of the exposure burls 45. As depicted in FIG. 3, the preparation burls 35 have a lateral dimension 35d and the exposure burls 45 have a lateral dimension 45d. For example, the lateral dimension 35d may be the diameter of the preparation burls 35 and the lateral dimension 45d may be the diameter of the exposure burls 45. By providing that the preparation end surfaces 36 have a larger area than the exposure end surfaces 46, the effect of the invention is improved.

In particular, there is a possibility that a contaminating particle 50 may be clamped in a region between preparation burls 35 at the pre-align table PT and subsequently clamped on top of an exposure burl 45 at the substrate table WT. If this happens, then the contaminating particle 50 can have a significant effect on overlay and focus errors. By providing that the preparation end surfaces 36 have a larger area than the exposure end surfaces 46, this possibility is reduced. In an embodiment the substrate W is clamped on the substrate table WT in a position that corresponds to its position on the pre-align table PT. This reduces the possibility mentioned above.

Figure 6:
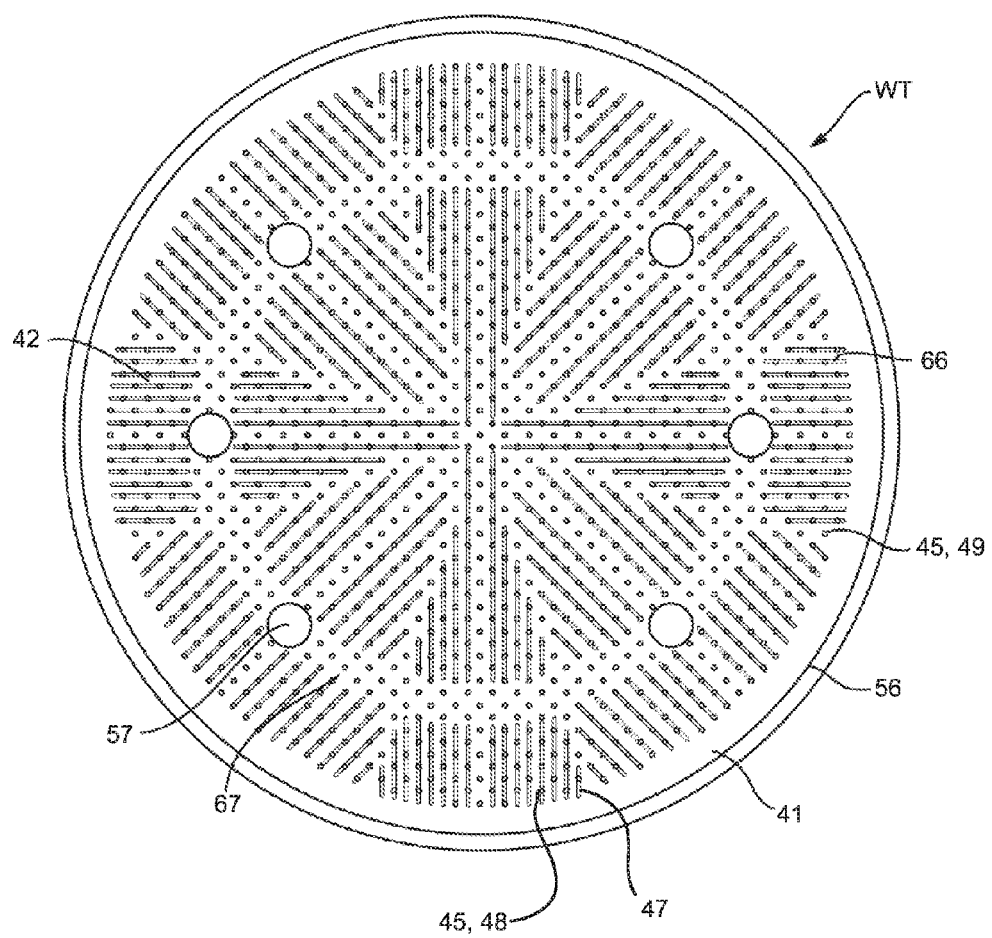
FIG. 6 depicts a substrate table of a lithographic apparatus.

FIG. 6 depicts schematically, in plan, a substrate table WT that may be used in the context of the present invention. As depicted in FIG. 6, in an embodiment the exposure burls 45 are arranged in an exposure burl pattern. In an embodiment the exposure burl pattern is substantially regular. For example, in an embodiment the pitch between the exposure burls 45 is substantially constant. Similarly, in an embodiment the preparation burls 35 are arranged in a preparation burl pattern. In an embodiment the preparation burl pattern substantially matches the exposure burl pattern.

As depicted in FIG. 6, in an embodiment the substrate table WT comprises a seal 56 at a peripheral region of the substrate table WT. The seal 56 may seal a chamber between the substrate W and the substrate table WT for vacuum clamping purposes. As depicted in FIG. 6, in an embodiment the substrate table WT comprises vacuum holes 57. The vacuum holes 57 may provide communication between the chamber and an underpressure. Gas may be extracted from the chamber via the vacuum holes 57 so as to reduce the pressure in the chamber, thereby applying the pressure clamping force as the exposure clamping force.

By providing that the preparation burl pattern substantially matches the exposure burl pattern, contaminating particles 50 are pre-crushed to an extent that is appropriate for their position at the substrate table WT. For example, contaminating particles 50 that are clamped between the exposure end surfaces 46 and the substrate W are pre-crushed between the preparation end surfaces 36 and the substrate W. Meanwhile, contaminating particles 50 that are clamped between the exposure base surface 42 and the substrate W are pre-crushed between the preparation base surface 32 and the substrate W. Accordingly, the effect on overlay and focus errors of substantially all contaminating particles is reduced.

FIG. 7 depicts schematically part of a lithographic apparatus 100 according to an embodiment of the invention. As depicted in FIG. 6 and FIG. 7, in an embodiment the exposure base surface 42 comprises an exposure mesa region 66. The exposure mesa region 66 has at least one exposure thermal transfer mesa 47 arranged in an exposure mesa pattern. FIG. 6 depicts an example of an exposure mesa pattern. The exposure thermal transfer mesas 47 are provided to increase thermal transfer between the substrate table WT and the substrate W. In an embodiment the temperature of the substrate W may be controlled via the substrate table WT. For example, a thermal conditioning system may be provided in the substrate table WT. By controlling the temperature of the substrate W, deformation of the substrate W caused by temperature fluctuations can be reduced.

As depicted in FIG. 7, in an embodiment the preparation base surface 32 comprises a preparation mesa region 61. The preparation mesa region 61 has at least one preparation thermal transfer mesa 37 arranged in a preparation mesa pattern. It might not be necessary to thermally condition the pre-align table PT. In an embodiment the preparation mesa pattern substantially matches the exposure mesa pattern. By providing that the preparation mesa pattern substantially matches the exposure mesa pattern, the contaminating particles 50 are pre-crushed to an extent appropriate for their position at the substrate table WT. For example, contaminating particles 50 that are clamped between the exposure mesa region 66 of the exposure base surface 42 and the substrate W are pre-crushed between the preparation mesa region 61 of the preparation base surface 32 and the substrate W.

As depicted in FIG. 7, in an embodiment the substrate table WT may have short exposure burls 48 and long exposure burls 49. The exposure burls 45 comprise the short preparation burls 48 and the long preparation burls 49. The preparation end surfaces 46 are in the exposure supporting plane 44. In an embodiment, in the case of a vacuum clamping mechanism, the short exposure burls 48 may be positioned near a vacuum groove or vacuum hole 57 (shown in FIG. 6) used to clamp the substrate W. Because of the vacuum in the vacuum groove, the heat transferred between the substrate W and the substrate table WT is reduced. In order to improve the heat transfer, the gap between the substrate W and the substrate table WT is partly filled, which results in the short exposure burls 48.

Similarly, the pre-align table PT may have short preparation burls 38 and long preparation burls 39. The preparation burls 35 comprise the short preparation burls 38 and the long preparation burls 39. In an embodiment the short preparation burls 38 are arranged such that contaminating particles 50 that may end up between the short exposure burls 48 on the substrate table WT are crushed. Contaminating particles 50 that end up between the long exposure burls 49 of the substrate table WT may not be crushed.

As depicted in FIG. 7, in an embodiment the short preparation burls 38 project from the preparation mesa region 61. At the preparation mesa region 61, the preparation base distance PB is defined as a preparation mesa gap PM between the preparation mesa region 61 and the preparation supporting plane 34. The long preparation burls 39 project from a preparation floor region 62 of the preparation base surface 32. The preparation floor region 62 does not have any preparation thermal transfer mesa 37. At the preparation floor region 62, the preparation base distance PB is defined as the preparation floor gap PF between the preparation floor region 62 and the preparation supporting plane 34.

Similarly, the short exposure burls 48 project from the exposure mesa region 66. At the exposure mesa region 66, the exposure base distance EB is defined as an exposure mesa gap EM between the exposure mesa region 66 and the exposure supporting plane 44. The long exposure burls 49 project from an exposure floor region 67 of the exposure base surface 42. The exposure floor region 67 does not have any exposure thermal transfer mesa 47. At the exposure floor region 67, the exposure base distance EB is defined as an exposure floor gap EF between the exposure floor region 67 and the exposure supporting plane 44.

For at least part of the holder-facing surface 52 of the substrate W, the preparation mesa gap PM is smaller than the exposure mesa gap EM by a mesa gap difference. The mesa gap difference is defined as the difference between the preparation mesa gap PM and the exposure mesa gap EM. For at least part of the holder-facing surface 52 of the substrate, the preparation floor gap PF is smaller than the exposure floor gap EF by a floor gap difference. The floor gap difference is defined as the difference between the preparation floor gap PF and the exposure floor gap EF.

In an embodiment the mesa gap difference is greater than the floor gap difference. This means that there is a bigger difference in burl height for the small burls on mesas compared to for the long burls. This is because the effect of pre-crushing on focus and overlay errors is greatest where the burl heights are small, i.e. on mesas. Hence, by providing that the mesa gap difference is large, the effect of providing the smaller burl height at the pre-crusher is maximised.

In an embodiment the method of clamping a substrate W comprises the pre-alignment positioner 91 and the pre-alignment position sensor 92 positioning the substrate W on the pre-align table PT such that the substrate W is positioned to an accuracy within the range of the exposure positioned 96 and the exposure position sensor 97. In an embodiment, the pre-align table PT performs the function of pre-crushing. Accordingly, it is not necessary to provide an additional object holder to perform the pre-crushing function. An embodiment of the invention is expected to achieve an improvement in focus and overlay errors without substantially increasing the cost of manufacturing the lithographic apparatus 100. Furthermore, by providing that the pre-align table PT performs the pre-crushing function, it is not necessary to transfer the substrate W to and from an additional object holder in the lithographic apparatus 100. Accordingly, an embodiment of the invention is expected to achieve an improvement in overlay and focus errors without substantially increasing the throughput time.

However, it is not necessary for the pre-align table PT to perform the pre-crushing function. In an embodiment a separate preparation object holder may be provided for performing the pre-crushing function. The separate preparation object holder may be a dedicated pre-crusher The substrate W may be transferred from the preparation object holder to the pre-align table PT. Alternatively, the substrate W may be transferred from the pre-align table PT to the preparation object holder for pre-crushing prior to the exposure process.

In an embodiment, there is provided a method of clamping an object for a lithographic apparatus. The method comprises providing a preparation object holder comprising a preparation main body having a preparation base surface. The preparation object holder is arranged to support a holder-facing surface of the object in a preparation supporting plane. The preparation base surface is arranged to face the preparation supporting plane and the holder-facing surface when the object is supported by the preparation object holder. A preparation base distance is defined between the preparation base surface and the preparation supporting plane. The method comprises providing an exposure object holder comprising an exposure main body having an exposure base surface. Wherein the exposure object holder is arranged to support the holder-facing surface in an exposure supporting plane. The exposure base surface is arranged to face the exposure supporting plane and the holder-facing surface when the object is supported by the exposure object holder. An exposure base distance is defined between the exposure base surface and the exposure supporting plane. The method comprises applying a preparation clamping force between the preparation object holder and the object on the preparation object holder, so as to deform any contaminating particle on the holder-facing surface. The method comprises transferring the object from the preparation object holder to the exposure object holder. The method comprises applying an exposure clamping force between the exposure object holder and the object on the exposure object holder, so as to hold the object for an exposure process. For at least part of the holder-facing surface, the preparation base distance is smaller than the exposure base distance.

The preparation clamping force may be greater than the exposure clamping force. The preparation clamping force may be less than the exposure clamping force.

In an embodiment, there is provided a method of clamping an object for a lithographic apparatus. The method comprises applying a preparation clamping force between a preparation object holder and an object on the preparation object holder, so as to deform any contaminating particle on a holder-facing surface of the object. The method comprises transferring the object from the preparation object holder to an exposure object holder. The method comprises applying an exposure clamping force between the exposure object holder and the object on the exposure object holder, so as to hold the object for an exposure process. The preparation clamping force is greater than the exposure clamping force.

The preparation object holder may comprise a preparation main body having a preparation base surface. The preparation object holder may be arranged to support a holder-facing surface of the object in a preparation supporting plane. The preparation base surface may be arranged to face the preparation supporting plane and the holder-facing surface when the object is supported by the preparation object holder. A preparation base distance is defined between the preparation base surface and the preparation supporting plane. The exposure object holder may comprise an exposure main body having an exposure base surface. The exposure object holder may be arranged to support a holder-facing surface of the object in an exposure supporting plane. The exposure base surface may be arranged to face the exposure supporting plane and the holder-facing surface when the object is supported by the exposure object holder. An exposure base distance may be defined between the exposure base surface and the exposure supporting plane. For at least part of the holder-facing surface, the preparation base distance may be smaller than the exposure base distance.

For the at least part of the holder-facing surface, the preparation base distance may be at least about 2 µm smaller than the exposure base distance.

The preparation object holder may comprise a plurality of preparation burls. The plurality of preparation burls may project from the preparation base surface and may have preparation end surfaces at the preparation supporting plane at preparation support locations to support the object. The exposure object holder may comprise a plurality of exposure burls. The plurality of exposure burls may project from the exposure base surface and may have exposure end surfaces at the exposure supporting plane at exposure support locations to support the object.

The preparation end surfaces may have a larger area than the exposure end surfaces.

The preparation burls may be arranged in a preparation burl pattern. The exposure burls may be arranged in an exposure burl pattern. The preparation burl pattern may substantially match the exposure burl pattern.

The preparation base surface may comprise a preparation mesa region having at least one preparation thermal transfer mesa arranged in a preparation mesa pattern. The exposure base surface may comprise an exposure mesa region having at least one exposure thermal transfer mesa arranged in an exposure mesa pattern. The preparation mesa pattern may substantially match the exposure mesa pattern.

The preparation burls may comprise short preparation burls and long preparation burls. The short preparation burls project from the preparation mesa region. The preparation base distance is defined as a preparation mesa gap between the preparation mesa region and the preparation supporting plane. The long preparation burls project from a preparation floor region of the preparation base surface not having the at least one preparation thermal transfer mesa. The preparation base distance is defined as a preparation floor gap between the preparation floor region and the preparation supporting plane. The exposure burls may comprise short exposure burls and long exposure burls. The short exposure burls project from the exposure mesa region. The exposure base distance is defined as an exposure mesa gap between the exposure mesa region and the exposure supporting plane. The long exposure burls project from an exposure floor region of the exposure base surface not having the at least one exposure thermal transfer mesa. The exposure base distance is defined as an exposure floor gap between the exposure floor region and the exposure supporting plane. For at least part of the holder-facing surface of the object, the preparation mesa gap may be smaller than the exposure mesa gap by a mesa gap difference. For at least part of the holder-facing surface of the object, the preparation floor gap may be smaller than the exposure floor gap by a floor gap difference. The mesa gap difference may be greater than the floor gap difference.

The preparation object holder may be arranged to support the holder-facing surface at preparation support location in the preparation supporting plane. The preparation support locations may be coplanar with the preparation base surface.

The step of transferring may comprise an exposure positioner and an exposure position sensor positioning the object on the exposure object holder. The method may comprise, before the step of applying the preparation clamping force, a pre-alignment positioner and a pre-alignment position sensor positioning the object on the preparation object holder such that the object is positioned to an accuracy within a range of the exposure positioner and the exposure position sensor. The pre-alignment positioner and the pre-alignment position sensor may have a greater range and less accuracy than the exposure positioner and the exposure position sensor.

The object may be one of a substrate and a patterning device.

The preparation object holder may be smaller than the object such that part of the object extends beyond the preparation object holder when the preparation object holder holds the object.

In an embodiment, there is provided a lithographic apparatus comprising a preparation object holder, an exposure object holder, a preparation clamping mechanism and an exposure clamping mechanism. The preparation object holder comprises a preparation main body having a preparation base surface. The preparation object holder is arranged to support a holder-facing surface of the object in a preparation supporting plane. The preparation base surface is arranged to face the preparation supporting plane and the holder-facing surface when the object is supported by the preparation object holder. A preparation base distance is defined between the preparation base surface and the preparation supporting plane. The exposure object holder comprises an exposure main body having an exposure base surface. The exposure object holder is arranged to support the holder-facing surface in an exposure supporting plane. The exposure base surface is arranged to face the exposure supporting plane and the holder-facing surface when the object is supported by the exposure object holder. An exposure base distance is defined between the exposure base surface and the exposure supporting plane. The preparation clamping mechanism is arranged to apply a preparation clamping force between the preparation object holder and the object on the preparation object holder, so as to deform any contaminating particle on a holder-facing surface of the object. The exposure clamping mechanism is arranged to apply an exposure clamping force between the exposure object holder and the object on the exposure object holder, so as to hold the object for an exposure process. For at least part of the preparation base surface and a corresponding part of the exposure base surface, the preparation base distance is smaller than the exposure base distance.

In an embodiment, there is provided a lithographic apparatus comprising an exposure object holder, a preparation object holder, a preparation clamping mechanism and an exposure clamping mechanism. The preparation clamping mechanism is arranged to apply a preparation clamping force between the preparation object holder and an object on the preparation object holder, so as to deform any contaminating particle at a holder-facing surface of the object. The exposure clamping mechanism is arranged to apply a preparation clamping force between the preparation object holder and an object on the preparation object holder, so as to hold the object for an exposure process. The preparation clamping mechanism is configured to apply a preparation clamping force that is greater than the exposure clamping force that the exposure clamping mechanism is configured to apply.

The preparation object holder may comprise a preparation main body having a preparation base surface. The preparation object holder may be arranged to support a holder-facing surface of the object in a preparation supporting plane. The preparation base surface may be arranged to face the preparation supporting plane and the holder-facing surface when the object is supported by the preparation object holder. A preparation base distance is defined between the preparation base surface and the preparation supporting plane. The exposure object holder comprises an exposure main body having an exposure base surface. The exposure object holder is arranged to support the holder-facing surface in an exposure supporting plane. The exposure base surface is arranged to face the exposure supporting plane and the holder-facing surface when the object is supported by the exposure object holder. An exposure base distance is defined between the exposure base surface and the exposure supporting plane. For at least part of the preparation base surface and a corresponding part of the exposure base surface, the preparation base distance is smaller than the exposure base distance.

For the at least part of the preparation base surface and a corresponding part of the exposure base surface, the preparation base distance may be at least about 2 µm smaller than the exposure base distance.

The preparation object holder may comprise a plurality of preparation burls. The plurality of preparation burls project from the preparation base surface and have preparation end surfaces at the preparation supporting plane at preparations support locations to support the object. The exposure object holder may comprise a plurality of exposure burls. The plurality of exposure burls project from the exposure base surface and have exposure end surfaces at the exposure supporting plane at exposure support locations to support the object.

The preparation end surfaces have a larger area than the exposure end surfaces.

The preparation burls may be arranged in a preparation burl pattern. The exposure burls may be arranged in an exposure burl pattern. The preparation burl pattern may substantially match the exposure burl pattern.

The preparation base surface may comprise a preparation mesa region having at least one preparation thermal transfer mesa arranged in a preparation mesa pattern. The exposure base surface may comprise an exposure mesa region having at least one exposure thermal transfer mesa arranged in an exposure mesa pattern. The preparation mesa pattern may substantially match the exposure mesa pattern.

The preparation burls may comprise short preparation burls and long preparation burls. The short preparation burls project from the preparation mesa region. The preparation base distance is defined as a preparation mesa gap between the preparation mesa region and the preparation supporting plane. The long preparation burls project from a preparation floor region of the preparation base surface not having the at least one preparation thermal transfer mesa. The preparation base distance is defined as a preparation floor gap between the preparation floor region and the preparation supporting plane. The exposure burls may comprise short exposure burls and long exposure burls. The short exposure burls project from the exposure mesa region. The exposure base distance is defined as an exposure mesa gap between the exposure mesa region and the exposure supporting plane. The long exposure burls project from an exposure floor region of the exposure base surface not having the at least one exposure thermal transfer mesa. The exposure base distance is defined as an exposure floor gap between the exposure floor region and the exposure supporting plane. For at least part of preparation mesa region and a corresponding part of the exposure mesa region, the preparation mesa gap is smaller than the exposure mesa gap by a mesa gap difference. For at least part of preparation floor region and a corresponding part of the exposure floor region, the preparation floor gap is smaller than the exposure floor gap by a floor gap difference.

The mesa gap difference may be greater than the floor gap difference.

The preparation object holder may be arranged to support the holder-facing surface at preparation support location in the preparation supporting plane. The preparation support locations may be coplanar with the preparation base surface.

The preparation object holder may be smaller than the exposure object holder.

In an embodiment, there is provided a device manufacturing method comprising using a lithographic apparatus to transfer a pattern from a patterning device to a substrate. The device manufacturing method comprises the method described above.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
 a first object holder configured to hold an object at a holder-facing surface, the object having the holder-facing surface,
 a second object holder configured to hold the object at the holder-facing surface,
 wherein the lithographic apparatus is arranged to deform a contaminating particle at the holder-facing surface more when the object is held at the second object holder than when the object is held at the first object holder.

2. The lithographic apparatus of claim 1, comprising a projection system configured to project a pattern with a radiation beam onto the object, wherein in the first object holder is configured to hold the object to receive the radiation beam.

3. The lithographic apparatus of one of the preceding claim 1, comprising a first clamping device and a second clamping device,
 wherein the first clamping device is arranged to apply a first clamping force to hold the object on the first object holder,
 wherein the second clamping device is arranged to apply a second clamping force to hold the object on the second object holder,
 wherein the second clamping force is larger than the first clamping force.

4. The lithographic apparatus of claim 1,
 wherein the first object holder comprises a first base surface,
 wherein the first object holder is arranged to support the holder-facing surface in a first supporting plane,
 wherein the first base surface is arranged to face the holder-facing surface when the object is held by the first object holder,
 wherein a first distance is defined between the first base surface and the first supporting plane,
 wherein the second object holder comprises a second base surface,
 wherein the second object holder is arranged to support the holder-facing surface in a second supporting plane,
 wherein the second base surface is arranged to face the holder-facing surface when the object is held by the second object holder,
 wherein a second distance is defined between the second base surface and the second supporting plane, and
 wherein the second distance is smaller than the first distance.

5. The lithographic apparatus of claim 4, wherein the second distance is at least about 2 µm smaller than the first distance.

6. The lithographic apparatus of one of the preceding claim 1, wherein the first object holder is arranged to support the object at a portion of the holder-facing surface, wherein the second object holder is arranged to support the object at substantially the same portion of the holder-facing surface.

7. The lithographic apparatus of claim 4,
 wherein the first object holder comprises a first plurality of burls, wherein the first plurality of burls project from the first base surface to the first supporting plane, wherein the first plurality of burls are arranged to support the object, and
 wherein the second object holder comprises a second plurality of burls, wherein the second plurality of burls project from the second base surface to the second supporting plane, wherein the second plurality of burls are arranged to support the object.

8. The lithographic apparatus of claim 7, wherein the first plurality of burls have first end surfaces in the first supporting plane, wherein the second plurality of burls have second end surfaces in the second supporting plane, wherein an area formed by the second end surfaces is larger than an area formed by the first end surfaces.

9. The lithographic apparatus of claim 7 or 8, wherein the first plurality of burls are arranged in a first pattern, wherein the second plurality of burls are arranged in a second pattern, wherein the first pattern is substantially the same as the second pattern.

10. The lithographic apparatus of claim 1, wherein the second object holder is smaller than the first object holder.

11. The lithographic apparatus of claim 1, comprising a sensor and a positioner, wherein the sensor is arranged to provide a measurement signal representative of a position of the object when held on the second object holder, the position being relative to the second object holder, and wherein the positioner is arranged to move the second object holder under control of the measurement signal.

12. A device manufacturing method comprising:
 holding an object at a first object holder of a lithographic apparatus at a holder-facing surface, the object having the holder-facing surface;
 holding the object at a second object holder at the holder-facing surface;
 deforming a contaminating particle at the holder-facing surface more when the object is held at the second object holder than when the object is held at the first object holder; and
 transferring, in the lithographic apparatus, a pattern to the object.

13. A method of clamping an object, the method comprising:
 holding the object at a first object holder at a holder-facing surface, the object having the holder-facing surface;
 holding the object at a second object holder at the holder-facing surface, wherein the second object holder is different from the first object holder; and
 deforming a contaminating particle at the holder-facing surface more when the object is held at the second object holder than when the object is held at the first object holder.

14. The method of claim 13, comprising projecting a radiation beam onto the object when the object is held by the first object holder.

15. The method of claim 13, further comprising:
 applying a first clamping force to hold the object on the first object holder;
 applying a second clamping force to hold the object on the second object holder, wherein the second clamping force is larger than the first clamping force.

* * * * *